(12) United States Patent
Tan et al.

(10) Patent No.: US 9,165,795 B2
(45) Date of Patent: Oct. 20, 2015

(54) HIGH PERFORMANCE LOW PROFILE QFN/LGA

(75) Inventors: Gin Ghee Tan, Penang (MY); Lai Beng Teoh, Penang (MY); Lay Hong Lee, Penang (MY)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 360 days.

(21) Appl. No.: 12/964,523

(22) Filed: Dec. 9, 2010

(65) Prior Publication Data

US 2012/0146213 A1    Jun. 14, 2012

(51) Int. Cl.
*H01L 29/40* (2006.01)
*H01L 21/56* (2006.01)
*H01L 23/31* (2006.01)
*H01L 23/00* (2006.01)

(52) U.S. Cl.
CPC ............ *H01L 21/563* (2013.01); *H01L 21/568* (2013.01); *H01L 23/3107* (2013.01); *H01L 24/16* (2013.01); *H01L 2224/13144* (2013.01); *H01L 2224/16245* (2013.01); *H01L 2224/32245* (2013.01); *H01L 2224/48247* (2013.01); *H01L 2224/48257* (2013.01); *H01L 2224/48465* (2013.01); *H01L 2224/73204* (2013.01); *H01L 2224/73265* (2013.01); *H01L 2924/00013* (2013.01)

(58) Field of Classification Search
None
See application file for complete search history.

(56) References Cited

U.S. PATENT DOCUMENTS

| | | | | |
|---|---|---|---|---|
| 5,656,550 | A * | 8/1997 | Tsuji et al. | 438/123 |
| 5,864,178 | A * | 1/1999 | Yamada et al. | 257/737 |
| 6,239,496 | B1 * | 5/2001 | Asada | 257/777 |
| 7,105,424 | B2 * | 9/2006 | Tsai et al. | 438/464 |
| 2001/0048166 | A1 * | 12/2001 | Miyazaki | 257/778 |
| 2002/0047200 | A1 * | 4/2002 | Bai | 257/738 |
| 2002/0110645 | A1 * | 8/2002 | Shelnut et al. | 427/402 |
| 2003/0003625 | A1 * | 1/2003 | Kotzias et al. | 438/112 |
| 2004/0032013 | A1 * | 2/2004 | Cobbley et al. | 257/678 |
| 2004/0245608 | A1 * | 12/2004 | Huang et al. | 257/676 |
| 2006/0003551 | A1 * | 1/2006 | Mancini et al. | 438/462 |
| 2008/0230898 | A1 * | 9/2008 | Meguro et al. | 257/737 |

* cited by examiner

*Primary Examiner* — Robert Bachner
(74) *Attorney, Agent, or Firm* — Lowenstein Sandler LLP

(57) ABSTRACT

A method for manufacturing a semiconductor device is disclosed. In one embodiment a semiconductor die is formed overlying a substrate. The semiconductor die is flip chip mounted to the substrate, wherein the substrate comprises a plurality of conductive traces. The semiconductor die and substrate are encapsulated with an encapsulating material. A top side of the encapsulating material is subjected to one of polishing, etching, and grinding to expose a top side of the semiconductor die. Finally, the bottom side of the substrate is subjected to one of polishing, etching, and grinding to remove the substrate and to reduce a thickness of the plurality of conductive traces.

13 Claims, 6 Drawing Sheets

HIGH PERFORMANCE LOW PROFILE QFN/LGA

TECHNICAL FIELD

The present disclosure relates generally to the field of semiconductor manufacturing and more specifically to the field of semiconductor miniaturization in Flip Chip and Quad Flat No Leads/Land Grid Array (QFN/LGA) configurations.

BACKGROUND

The trend in the semiconductor industry today is the production of ever increasingly more capable semiconductor components, while decreasing component size and total semiconductor package height. QFN/LGA configurations are popular methods to realize increased semiconductor device density. With the need to achieve ever smaller package sizes and thinner package heights being an ongoing driver, new methodologies are sought.

FIG. 1A is a cross-sectional view of a Quad Flat No Leads configuration semiconductor package. As is well known in the art, QFN configurations are used to physically and electrically connect semiconductor devices making up integrated circuits to printed circuit boards. As illustrated in FIG. 1A, a semiconductor chip 102 is placed onto a substrate 104. In an exemplary embodiment, an adhesive 106 is used to bind the semiconductor chip 102 to the substrate 104. Wire loops 108 electrically connect the semiconductor chip 102 to the substrate 104. However, as further illustrated in FIG. 1A, the semiconductor chip die 102 thickness, the above mentioned wire loops 108, encapsulating material 110 thickness (as determined by the encapsulating mold thickness), and substrate material 104 thickness, all contribute to the overall package thickness and will result in overall package thicknesses in excess of 300 microns.

FIG. 1B is a cross-sectional view of a semiconductor configuration as disclosed by Asada (U.S. Pat. No. 6,239,496), hereinafter "Asada." As illustrated in FIG. 1B, the substrate 152 is an insulating polymide film 50-75 microns thick with 18 micron thick copper traces 154 laid onto it, with the copper traces laid as a thin film laminated to the substrate 152 which is later patterned. A semiconductor chip die 156 is electrically connected to the substrate 152 through gold bumps 158. The semiconductor chip 156 is allowed to flex using an anisotropically conductive adhesive as the connecting resin 160 that attaches the semiconductor chip 156 to the substrate 152. Lastly, the semiconductor chip die 156 is 50 microns thick. Therefore, as Asada discloses, and as illustrated in FIG. 1B, the semiconductor chip 156 thickness, the copper lead 154 thickness and the substrate 152 thickness still result in an overall semiconductor package thickness of about 200 microns.

SUMMARY OF THE INVENTION

This present invention provides a solution to the challenges inherent in producing low clearance semiconductor devices. In a method according to one embodiment of the present invention, a process for manufacturing a semiconductor device is disclosed. A semiconductor die with a first die thickness is thinned to a second die thickness. The semiconductor die is flip chip mounted to a substrate comprising a plurality of conductive traces. The semiconductor die and substrate are encapsulated in epoxy. A top side of the encapsulating material is subjected to polishing, etching, or grinding to expose a top side of the semiconductor die. The bottom side of the substrate is also subjected to polishing, etching, or grinding to remove the substrate and to reduce a thickness of the plurality of conductive traces.

In another method according to a further embodiment of the present invention, a process for manufacturing a semiconductor device is disclosed. A semiconductor die with a first die thickness is flip chip mounted to a substrate comprising a plurality of conductive traces. The semiconductor die and substrate are encapsulated in epoxy. A top side of the encapsulating material is subjected to polishing, etching, or grinding to expose a top side of the semiconductor die and to reduce the die thickness to a second die thickness. The bottom side of the substrate is also subjected to polishing, etching, or grinding to remove the substrate and to reduce a thickness of the plurality of conductive traces.

In another method according to a further embodiment of the present invention, a process for manufacturing a semiconductor device is disclosed. A semiconductor die with a first die thickness is flip chip mounted to a substrate comprising a plurality of conductive traces. The semiconductor die and substrate are underfilled with epoxy, wherein the underfill material fills the space between the substrate and the semiconductor die. A top side of the semiconductor die is subjected to polishing, etching, or grinding to reduce the die thickness to a second die thickness. The bottom side of the substrate is also subjected to polishing and/or grinding to remove the substrate and to reduce a thickness of the plurality of conductive traces.

In a semiconductor device according to a further embodiment of the present invention, a semiconductor device is disclosed. The semiconductor device comprises a semiconductor die flip chip mounted to a plurality of conductive traces, wherein an epoxy material encapsulates the semiconductor die, wherein the encapsulating material is level with a top side of the semiconductor die such that the top side of the semiconductor die is exposed, and wherein the encapsulating resin is level with a bottom side of the conductive traces such that the bottom side of the conductive traces is exposed.

BRIEF DESCRIPTION OF THE DRAWINGS

The present invention will be better understood from a reading of the following detailed description, taken in conjunction with the accompanying drawing figures in which like reference characters designate like elements and in which.

DETAILED DESCRIPTION

Figure 1A:
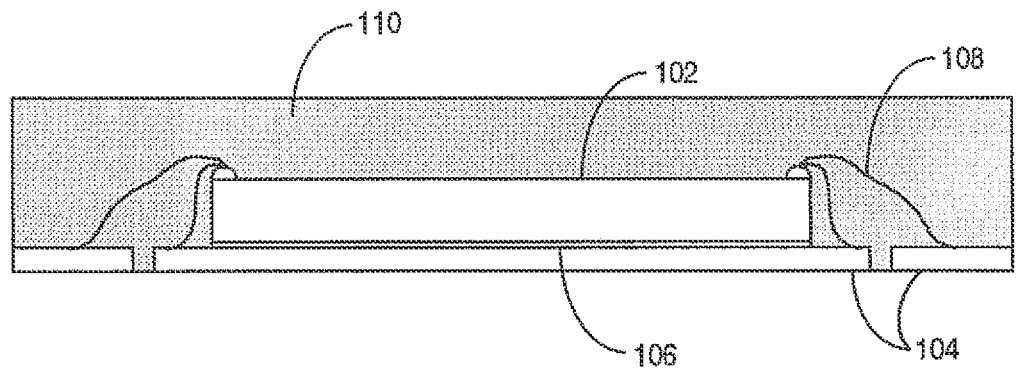
FIG. 1A illustrates a schematic cross-section of a semiconductor device according to the prior art exhibiting an overall semiconductor device package thickness.
Figure 1B:
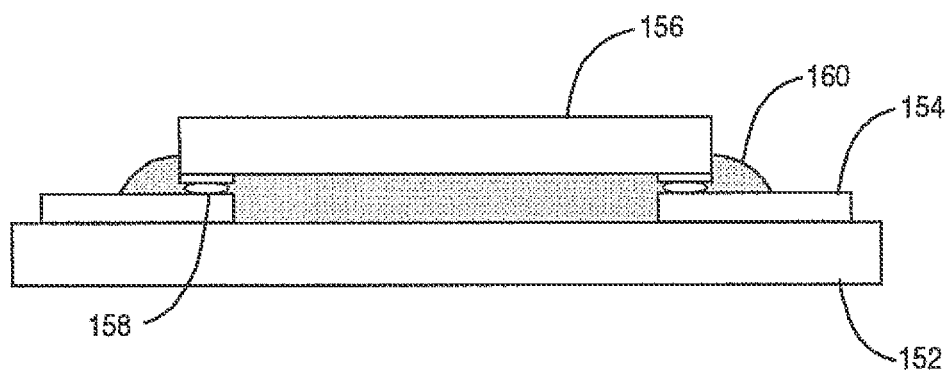
FIG. 1B illustrates a schematic cross-section of a semiconductor device according to the prior art exhibiting an overall semiconductor device package thickness.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature:

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" (refers to semiconductor packaging assembly or manufacturing process) or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

This present invention provides a solution to the increasing challenges inherent in manufacturing semiconductor devices with low-clearance requirements. Various embodiments of the present disclosure provide a reduced semiconductor device package thickness. As discussed in detail below, after a semiconductor die is flip chip mounted to a substrate comprising a plurality of conductive traces, the semiconductor die may be thinned through polishing, etching, or grinding. Further, the substrate is removed entirely and the undersides of the conductive traces are thinned with polishing, etching or grinding.

Figure 2:
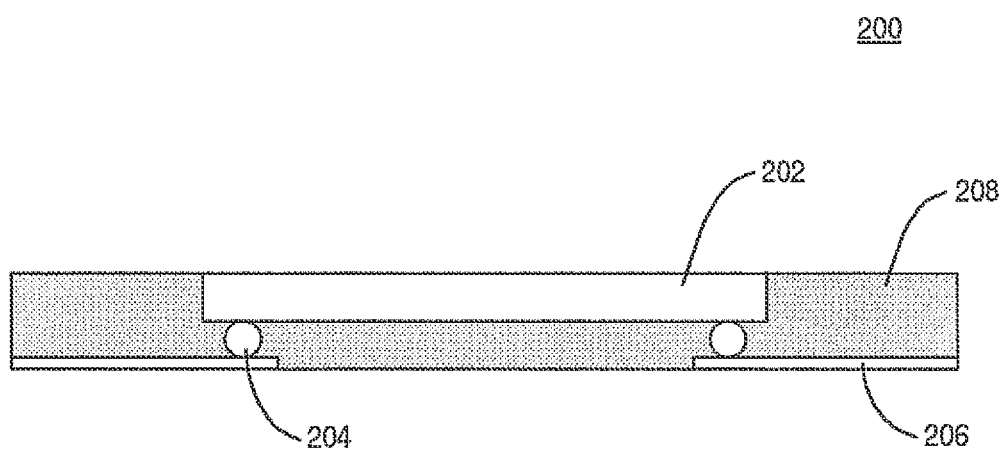
FIG. 2 illustrates a schematic cross-section of a semiconductor device in accordance with an embodiment of the present invention.

FIG. 2 illustrates an exemplary embodiment of the present invention. Methods for manufacturing the embodiment illustrated in FIG. 2 are discussed in detail below. In FIG. 2, a semiconductor die 202 of a selected thickness is flip chip mounted to a plurality of conductive traces 206. In one exemplary embodiment, the conductive traces are formed of copper, although other conductive materials may be used, such as gold. As discussed below, in one exemplary embodiment, when the semiconductor die 202 is flip chip mounted to the conductive traces 206, the conductive traces 206 are formed on the upper surface of a substrate (not shown). In one exemplary embodiment, the semiconductor device 202 is electrically connected to the conductive traces 206 with a plurality of gold bumps 204. In another embodiment, the semiconductor device 202 is electrically connected to the conductive traces 206 with other suitable flip chip interconnections. As further illustrated in FIG. 2, in one exemplary embodiment of the present invention, the semiconductor die 202 and conductive traces 206 may be encapsulated by an encapsulating material 208, wherein the encapsulating shape is formed by a mold. In an exemplary embodiment, the encapsulating material is an epoxy mold compound. As discussed in detail below, the overall semiconductor package 200 can achieve a total package height of only 100 microns when the conductive traces 206 are polished to 1 mil (i.e., 25.4 microns) thickness. Further, the semiconductor package 200 may even achieve sub-100 micron total package thickness by further reducing the semiconductor die thickness, flip chip interconnection thickness, and conductive trace thickness.

Figure 3:
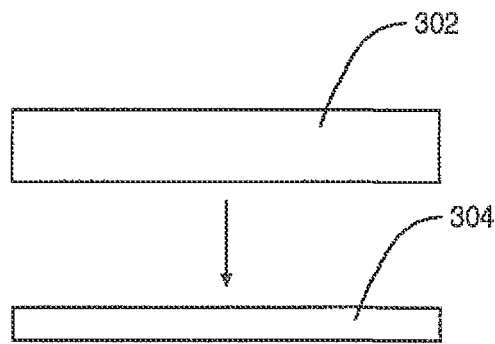
FIG. 3 illustrates a schematic cross-section of a semiconductor device in accordance with an embodiment of the present invention.
Figure 4:
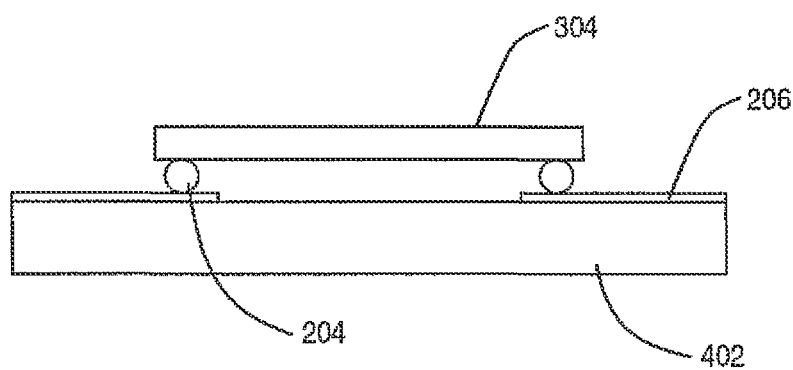
FIG. 4 illustrates a schematic cross-section of a semiconductor device in accordance with an embodiment of the present invention.
Figure 5A:
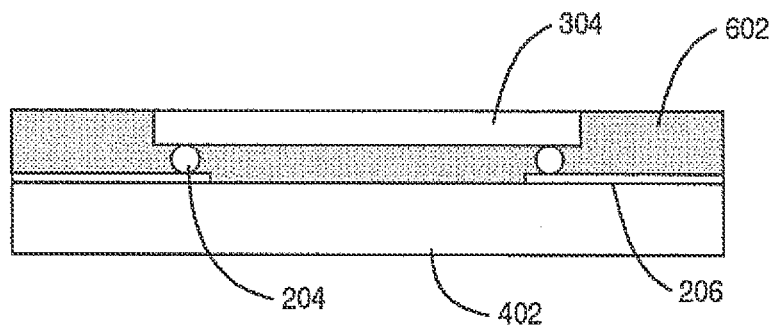
FIG. 5A illustrates a schematic cross-section of a semiconductor device in accordance with an embodiment of the present invention.
Figure 5B:
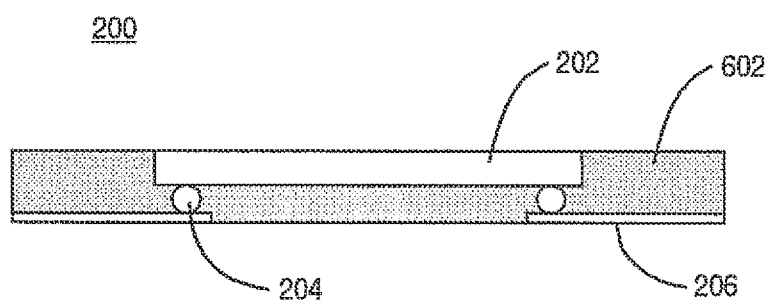
FIG. 5B illustrates a schematic cross-section of a semiconductor device in accordance with an embodiment of the present invention.
Figure 6A:
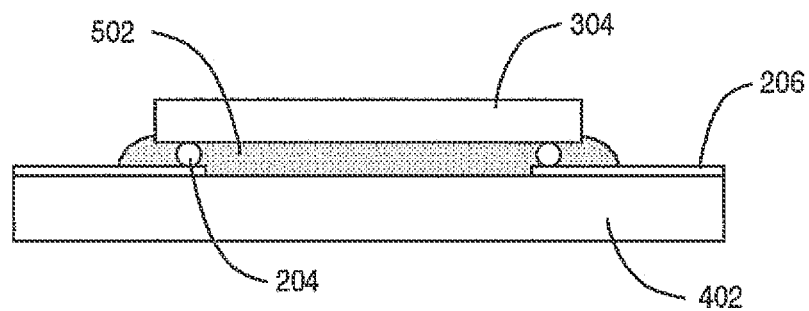
FIG. 6A illustrates a schematic cross-section of a semiconductor device in accordance with an embodiment of the present invention.
Figure 6B:
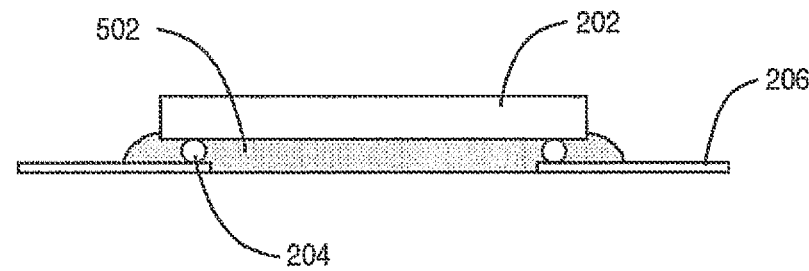
FIG. 6B illustrates a schematic cross-section of a semiconductor device in accordance with an embodiment of the present invention.

FIGS. 3, 4, 5A, and 5B illustrate the manufacturing steps for an embodiment of the present invention as illustrated in FIG. 5B and FIG. 2. FIGS. 6A and 6B illustrate manufacturing steps continuing on after steps 3 and 4 for a further embodiment of the present invention as illustrated in FIG. 6B.

As illustrated in FIG. 3, a selected semiconductor die 302 may be thinned before flip chip mounting. Such thinning may be performed through polishing, grinding, or etching, as well as any other suitable means. The polishing, grinding, or etching, or a combination thereof, may be performed according to any one of many methods well known in the arts. In one exemplary embodiment of the present invention, the semiconductor die 304 may be thinned to a thickness of no more than 2 mils (i.e., 50.8 microns). In further embodiments, the semiconductor die 304 may be thinned to a thickness of no more than 1 mil (i.e., 25.4 microns).

As illustrated in FIG. 4, the thinned semiconductor die 304 is flip chip mounted to a substrate 402 with a plurality of conductive traces 206 formed upon it. The conductive traces 206 may be formed in any one of several ways well known in the art, such as by patterning a layer of copper applied to the upper surface of the substrate. In one exemplary embodiment, the conductive traces 206 may also be composed of one-sided conductor/metal plated tape (such as Cu plated polyamide tape (PI) tape). The conductive traces 206 or carriers will conduct the signal out from the semiconductor die to the external world. The substrate 402 of FIG. 4 in one exemplary embodiment may be a laminate substrate. In other embodiments, the substrate may comprise polyamide tape (PI), ceramic, or lead frame, etc.

As illustrated in FIG. 5A, the semiconductor die 304 and conductive traces 206 are encapsulated. In one exemplary embodiment, the encapsulation is performed with an epoxy mold compound and a low-clearance mold, the molded encapsulation just clearing the top of the semiconductor die 304 (not shown). The encapsulating material (e.g., epoxy) overlying a top surface of the semiconductor die 304 is removed until the encapsulating material is even with the top surface of the semiconductor die 304. In other words, the top surface of the semiconductor die 304 is now exposed. In an exemplary embodiment, the encapsulating material covering the semiconductor die 304 is removed by polishing, grinding, and/or etching. In one exemplary embodiment, the polishing or grinding may be continued on the exposed top surface of the semiconductor die 304 to further thin the semiconductor die 304. Such continued grinding and/or polishing allows the semiconductor die 304 to be either thinned before it is flip chip mounted to the conductive traces 206 and substrate 402 (as discussed above) or after it is flip chip mounted to the conductive traces 206 and substrate 402. In a further embodiment, the semiconductor die 304 may be thinned before it is flip chip mounted to the conductive traces 206 and substrate 402 and again thinned after the flip chip mounting and encapsulation.

As illustrated in FIG. 5B, the semiconductor die 202 has been thinned to the desired thickness. Such thinning, as discussed above, was performed either before flip chip mounting, after flip chip mounting, or both. As further illustrated in FIG. 5B, the substrate 402 (not shown) is polished, ground, or etched until it is completely removed and the undersides of the conductive traces 206 are exposed. The polishing, grinding, or etching that removed the substrate 402 may then be continued to reduce the thicknesses of the conductive traces 206. Because the thinned conductive traces 206 may smear during the polishing, grinding, or etching, the thinned conductive traces 206 may be treated with a mild acid or subjected to a fine polishing to de-smear them.

In an exemplary embodiment, the conductive traces 206 are reduced to a thickness of no more than 1 mil (i.e., 25.4 microns). With the semiconductor die 202 thinned to no more than 2 mils (i.e., 50.8 microns) and the conductive traces thinned to no more than 1 mil (i.e., 25.4 microns), the overall semiconductor device package 200 height can be limited to a total package height of only 100 microns. In further embodiments, the semiconductor device package 200 may be limited to a total package thickness of under 100 microns by further reducing the semiconductor die thickness, flip chip interconnection thickness, and conductive trace thicknesses.

As illustrated in FIGS. 6A and 6B, instead of applying an encapsulating material, illustrated in FIG. 5A, an underfill material may be used instead. The use of an underfill material 502 is illustrated in FIG. 6A. In one exemplary embodiment, the underfill material 502 is an epoxy compound. With underfill material 502 applied between the semiconductor die 304 and the substrate 402 and conductive traces 206, the semiconductor die 304, as discussed above, may be further thinned as desired.

As illustrated in FIG. 6B, the semiconductor die 202 has been thinned to the desired thickness. Such thinning, as discussed above, was performed either before flip chip mounting, or after flip chip mounting, or both. As further illustrated in FIG. 6B, the substrate 402 (not shown) is polished, ground, or etched until it is completely removed and the undersides of the conductive traces 206 are exposed. The polishing, grinding, or etching used to remove the substrate 402 may be continued to reduce the thickness of the conductive traces 206. In an exemplary embodiment, the conductive traces 206 are reduced to a thickness of no more than 1 mil (i.e., 25.4 microns). Because the thinned conductive traces 206 may smear during the polishing, grinding, or etching, the thinned conductive traces 206 may be treated with a mild acid or subjected to a fine polishing to de-smear them.

As discussed above, with the semiconductor die 202 and the conductive traces thinned, the overall semiconductor device package 200 height may be limited to a total package height of only 100 microns. In further embodiments, as also discussed above, the semiconductor device package 200 may be further limited to a total package thickness of under 100 microns by further reducing the semiconductor die thickness, flip chip interconnection thickness, and conductive trace thicknesses.

Figure 7:
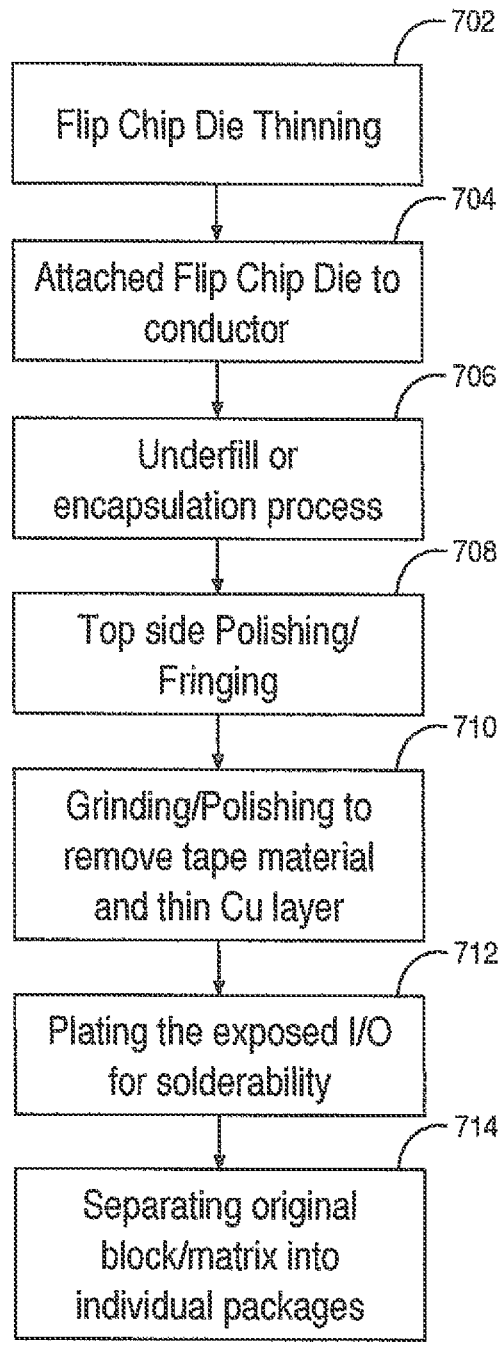
FIG. 7 illustrates a flow diagram, illustrating the steps to a method in accordance with an embodiment of the present invention.

FIG. 7 illustrates the steps to a process to manufacture a semiconductor device with a reduced total package height. The process in FIG. 7 begins in step 702 by thinning the semiconductor die. This semiconductor die thinning is also illustrated in FIG. 3. As noted above, the step of thinning the semiconductor die may be omitted, to be performed later.

In step 704, the semiconductor chip is flip chip mounted to a substrate comprising a plurality of conductive traces. In step 706, the semiconductor die and conductive traces may be encapsulated or an underfill material may be applied between the substrate and the conductive traces. In step 708, the top side of the semiconductor die is further polished, ground, or etched to further thin the semiconductor die.

As illustrated in FIG. 5A and FIG. 5B, and as discussed above, the polishing, grinding, or etching may be used to reduce the encapsulating material such that the top surface of the semiconductor die is exposed, without further thinning of the semiconductor die. Therefore, there exist two semiconductor die thinning periods: before flip chip mounting and after flip chip mounting and encapsulation/underfill. Either semiconductor die thinning period or both may be utilized in exemplary embodiments.

In step 710, the substrate is polished, ground, or etched away and the bottom surfaces of the conductive traces are also polished, ground, or etched to reduce the thicknesses of the conductive traces. After the conductive traces are thinned, as discussed above, they may be treated with a mild acid or subjected to fine polishing to de-smear them. In step 712, the exposed portions of the conductive traces that make up part of the input/output circuitry plated to aid in solderability, as is well known in the art. In the final step 714, the matrix or block of semiconductor dies is divided into individual packages, as is also well known in the art.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method for manufacturing a semiconductor device comprising:
flip chip mounting a first side of a semiconductor die to a substrate comprising a plurality of conductive traces, wherein a second side of the semiconductor die is subjected to one of polishing, etching, and grinding to reduce a thickness of the semiconductor die to be no greater than 2 mils prior to the flip chip mounting;
encapsulating the semiconductor die and substrate with an encapsulating material;
subjecting a top side of the encapsulating material to one of polishing, etching, and grinding to expose the second side of the semiconductor die;
subjecting the bottom side of the substrate to one of polishing, etching, and grinding to remove the substrate; and
reducing a thickness of the plurality of conductive traces by continuing the one of polishing, etching, and grinding after the substrate has been removed, wherein the substrate is removed and then the thickness of the plurality of conductive traces is reduced in one continuous step.

2. The method for manufacturing a semiconductor device according to claim 1, further comprising one of polishing, etching, and grinding the second side of the semiconductor die to reduce a thickness of the semiconductor die after the second side of the semiconductor die has been exposed.

3. The method for manufacturing a semiconductor device according to claim 1, wherein the encapsulating material is formed from an epoxy mold compound.

4. The method for manufacturing a semiconductor device according to claim 1, wherein the semiconductor die and the conductive traces are electrically connected with flip chip interconnections.

5. The method for manufacturing a semiconductor device according to claim 1, wherein flip chip interconnections are gold bumps.

6. The method for manufacturing a semiconductor device according to claim 1, wherein the conductive traces are formed of copper.

7. The method for manufacturing a semiconductor device according to claim 1, wherein the conductive traces are subjected to one of a mild acid and fine polishing after the thickness of the plurality of conductive traces has been reduced to de-smear the conductive traces.

8. A method for manufacturing a semiconductor device comprising:
flip chip mounting a first side of a semiconductor die to a substrate comprising a plurality of conductive traces, wherein a second side of the semiconductor die is subjected to one of polishing, etching, and grinding to reduce a thickness of the semiconductor to be no greater than 2 mils die prior to the flip chip mounting;
encapsulating the semiconductor die and substrate with an encapsulating material;
subjecting a top side of the encapsulating material to one of polishing, etching, and grinding to expose the second side of the semiconductor die and to reduce a thickness of the semiconductor die; and
subjecting the bottom side of the substrate to one of polishing, etching, and grinding to completely remove the substrate and to reduce a thickness of the plurality of conductive traces and continuing the one of polishing, etching, and grinding after the substrate has been removed to reduce a thickness of the plurality of conductive traces, wherein the substrate is removed and then the thickness of the plurality of conductive traces is reduced in one continuous step.

9. The method for manufacturing a semiconductor device according to claim 8, wherein the encapsulating material is formed from an epoxy mold compound.

10. The method for manufacturing a semiconductor device according to claim 8, wherein the semiconductor die and the conductive traces are electrically connected with flip chip interconnections.

11. The method for manufacturing a semiconductor device according to claim 10, wherein the flip chip interconnections are gold bumps.

12. The method for manufacturing a semiconductor device according to claim 8, wherein the conductive traces are formed of copper.

13. The method for manufacturing a semiconductor device according to claim 12, wherein the copper traces are subjected to one of a mild acid and fine polishing after the thickness of the plurality of conductive traces has been reduced to de-smear the copper traces.

* * * * *